United States Patent
Jaaskelainen

(10) Patent No.: US 10,352,818 B2
(45) Date of Patent: Jul. 16, 2019

(54) MONITORING SYSTEM FOR COLD CLIMATE

(71) Applicant: Halliburton Energy Services, Inc., Houston, TX (US)

(72) Inventor: Mikko Jaaskelainen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/743,462

(22) PCT Filed: Aug. 31, 2015

(86) PCT No.: PCT/US2015/047751
§ 371 (c)(1),
(2) Date: Jan. 10, 2018

(87) PCT Pub. No.: WO2017/039617
PCT Pub. Date: Mar. 9, 2017

(65) Prior Publication Data
US 2018/0202894 A1    Jul. 19, 2018

(51) Int. Cl.
| | |
|---|---|
| H04B 10/079 | (2013.01) |
| G01M 11/00 | (2006.01) |
| H01L 31/042 | (2014.01) |
| H02S 40/42 | (2014.01) |
| H02S 20/10 | (2014.01) |
| F24T 10/40 | (2018.01) |
| H05K 7/20 | (2006.01) |
| F24T 10/30 | (2018.01) |
| H02S 40/38 | (2014.01) |

(52) U.S. Cl.
CPC ........... *G01M 11/319* (2013.01); *F24T 10/30* (2018.05); *F24T 10/40* (2018.05); *H01L 31/042* (2013.01); *H02S 20/10* (2014.12); *H02S 40/425* (2014.12); *H04B 10/079* (2013.01); *H05K 7/20336* (2013.01); *H02S 40/38* (2014.12); *Y02E 10/10* (2013.01); *Y02E 10/50* (2013.01)

(58) Field of Classification Search
CPC .......................... H04B 10/079; G01M 11/319
See application file for complete search history.

(56) References Cited

U.S. PATENT DOCUMENTS

| | | | |
|---|---|---|---|
| 5,892,690 A * | 4/1999 | Boatman | G05B 19/042 340/870.02 |
| 2007/0108201 A1* | 5/2007 | Vinegar | C10L 3/08 219/770 |
| 2010/0238027 A1* | 9/2010 | Bastianini | G01D 9/005 340/540 |

(Continued)

FOREIGN PATENT DOCUMENTS

| | | |
|---|---|---|
| KR | 1020090115624 B1 | 11/2009 |
| WO | 1998040859 A1 | 9/1998 |

OTHER PUBLICATIONS

International Application Serial No. PCT/US2015/047751, International Search Report, dated Aug. 2, 2016, 3 pages.

(Continued)

*Primary Examiner* — Dzung D Tran
(74) *Attorney, Agent, or Firm* — Gilliam IP PLLC

(57) ABSTRACT

A method and system for operating fiber optic monitoring systems utilizing solar panels, batteries, and an interrogator system with associated electronics for operating in cold climates.

9 Claims, 4 Drawing Sheets

(56) References Cited

U.S. PATENT DOCUMENTS

2012/0255706 A1* 10/2012 Tadayon ............ F28D 20/0039
165/47
2015/0053366 A1* 2/2015 Melsheimer ............ F28D 20/00
165/10
2015/0331972 A1* 11/2015 McClure ................ H02S 10/00
703/2

OTHER PUBLICATIONS

International Application Serial No. PCT/US2015/047751, International Written Opinion, dated Aug. 2, 2016, 8 pages.
CA Application Serial No. 2,991,700; Examiner's Letter; dated Nov. 16, 2018, 3 pages.

* cited by examiner

MONITORING SYSTEM FOR COLD CLIMATE

BACKGROUND

This disclosure relates generally to systems and methods for enabling cost efficient monitoring using electronics and optics in cold climates.

Fiber optic distributed sensing systems were developed in the 1980s to replace older measurement systems composed of multiple individual sensors.

Fiber optic distributed sensing systems are commonly based on Optical Time-Domain Reflectometry (OTDR) and utilizes techniques originally derived from telecommunications cable testing. Today fiber optic distributed sensing systems provides a cost-effective way of obtaining hundreds, or even thousands, of highly accurate, high-resolution measurements and today find widespread acceptance in industries such as oil and gas, electrical power, and process control.

Cold climate areas in which oil and gas exploration is being done often require permanent monitoring solutions utilizing fiber optics and associated electronics and these have several challenges from a logistics and/or environmental perspective. Monitoring wells in Canada may be placed in marshes and access is only available in the winter when the ground is frozen. The available daylight is low and the location normally doesn't have infrastructure so power must be supplied through batteries and solar panels. Temperature may dip as low as −40 C in the winter posing challenges for electronics and optics in terms of operating temperature as many systems operate to a low end temperature of 0 C or maybe down to −20 C. Heating the electronics is costly as the power system with batteries and solar panels grows and may not be practical. Heating of the electronics/optics and heat absorbed by the solar panels and structure holding the solar panels may also concentrate heat to the sensing pad and thereby heat the ground faster than the surrounding area, causing an environmental impact. It is therefore desirable to have a more efficient system that minimizes the solar panels, batteries and environmental footprint, both mechanical environmental and visual while keeping the batteries and solar panels warm enough for efficient operation.

The systems and methods described herein address these needs.

DETAILED DESCRIPTION

Figure 1:
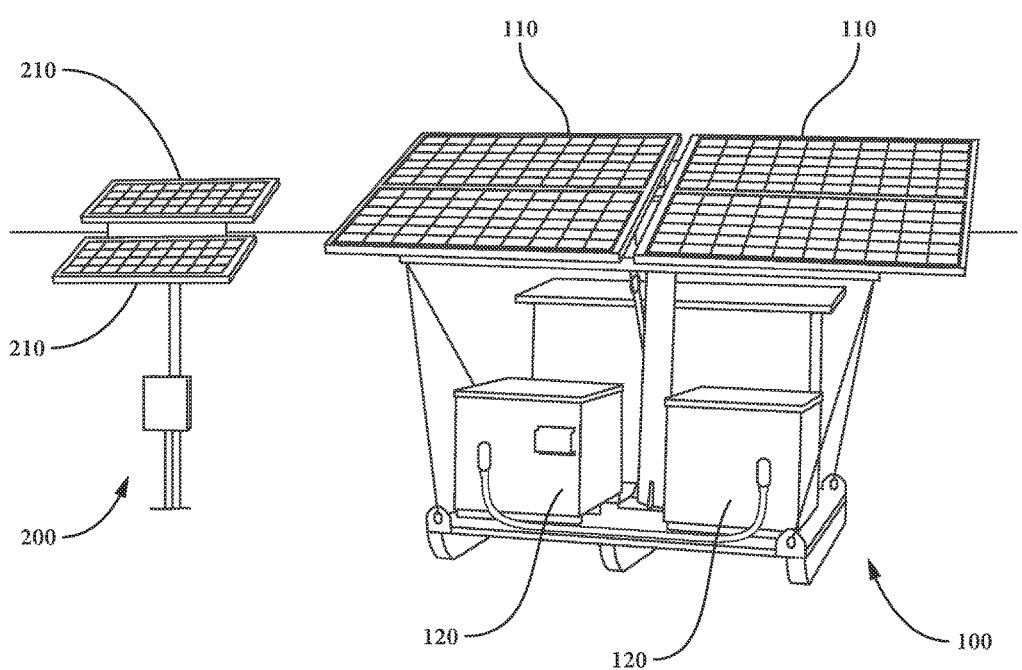
FIG. 1 is a comparison between a typical conventional arrangement with large solar panels and battery power storage and the size expected in the approach described herein.

In the following detailed description, reference is made to accompanying drawings that illustrate embodiments of the present disclosure. These embodiments are described in sufficient detail to enable a person of ordinary skill in the art to practice the disclosure without undue experimentation. It should be understood, however, that the embodiments and examples described herein are given by way of illustration only, and not by way of limitation. Various substitutions, modifications, additions, and rearrangements may be made without departing from the spirit of the present disclosure. Therefore, the description that follows is not to be taken in a limited sense, and the scope of the present disclosure will be defined only by the final claims.

The proposal is to use heat pipes that are designed to only operate under certain conditions. The heat pipes should be several feet long where one end is buried in the ground to a point below the depth where the ground will freeze in the winter, and the other end will be tied to a heat sink in close proximity or in contact with electronics/optics and/or batteries.

The basic assumption herein is that the temperature in the ground is warmer than the temperature of the heat sink, i.e. winter. The heat pipes will be filled with a suitable liquid that will boil/evaporate at a given temperature, and this heat absorbed from the ground will rise if the lower end of the heat pipe is warmer than the upper end. The gas will then condense, cool down and release heat to the heat sink, and the liquid will then fall down to the bottom of the heat pipe where it may absorb heat and evaporate and move heat from the ground to the heat sink. The system described is passive in that no pumps are required.

The temperature of the heat sink will be higher than the in-ground temperature in the summer, and the heat transport will then cease. The metal heat pipe may act as a part of the heat sink thereby stabilizing the temperature of the heat sink even further. The heat pipe is completely passive and proper design of the internal pressure and proper selection of the fluid will set a proper operating point. The working fluid for a heat pipe must be carefully chosen to make sure that the range of temperatures and pressures must fall within the two-phase region of the fluid so the evaporation and condensation can occur. Material selection should also be considered to avoid corrosion between materials once the heat pipe and system is installed.

The solution allows the use of heat from the ground to be used during the winter, and the heat removed from the ground will keep the ground frozen and thereby keeping area around the monitoring equipment stable. No power will be required to heat the electronics during the low light winter period so smaller solar panels and batteries can be used reducing cost and environmental impact due to easier field installation and smaller equipment in the field. Electronics and optics in the surface instrumentation will also be kept within a smaller environmental temperature range and thereby improving the sensing system performance.

Opto-electronic systems and components often use Peltier elements, or Thermo-Electric Coolers (TEC's), to heat and cool e.g. lasers, laser diodes and detectors. The intent is to keep e.g. lasers at a constant temperature to avoid a temperature induced shift of the operating wavelength, and/or temperature induced changes in detector sensitivity. Operation across a large environmental temperature range require the use of larger Peltier elements consuming more electrical power, and Peltier elements tend to be limited in terms of the maximum temperature differential they can handle. The Peltier element get less efficient the larger the temperature differential is between the set-point and environmental temperature. A system need to maintain the set temperature even at the edges of a large temperature range, and Pelter elements can in some cases have a thermal run-away where a device may e.g. convert the electrical energy to heat instead of removing heat from the opto-electric component that needs to be maintained at a constant temperature for proper operation. One side of the Peltier elements may be conductively connected to the heat sink.

FIG. 1 is a comparison illustration of two example systems that might be used in cold climates in remote regions in which there is limited support infrastructure and therefore solar panels and batteries are used to power the monitoring instrumentation. On the right side of FIG. 1 system 100 represents a current system in which rather large solar panels 110 and large batteries 120 are needed to overcome the difficulties of the very low temperatures in winter conditions. On the left hand side of FIG. 1 system 200 represents the inherently smaller and more cost effective system proposed herein in which much smaller solar panels 210 and batteries are needed.

Figure 2:
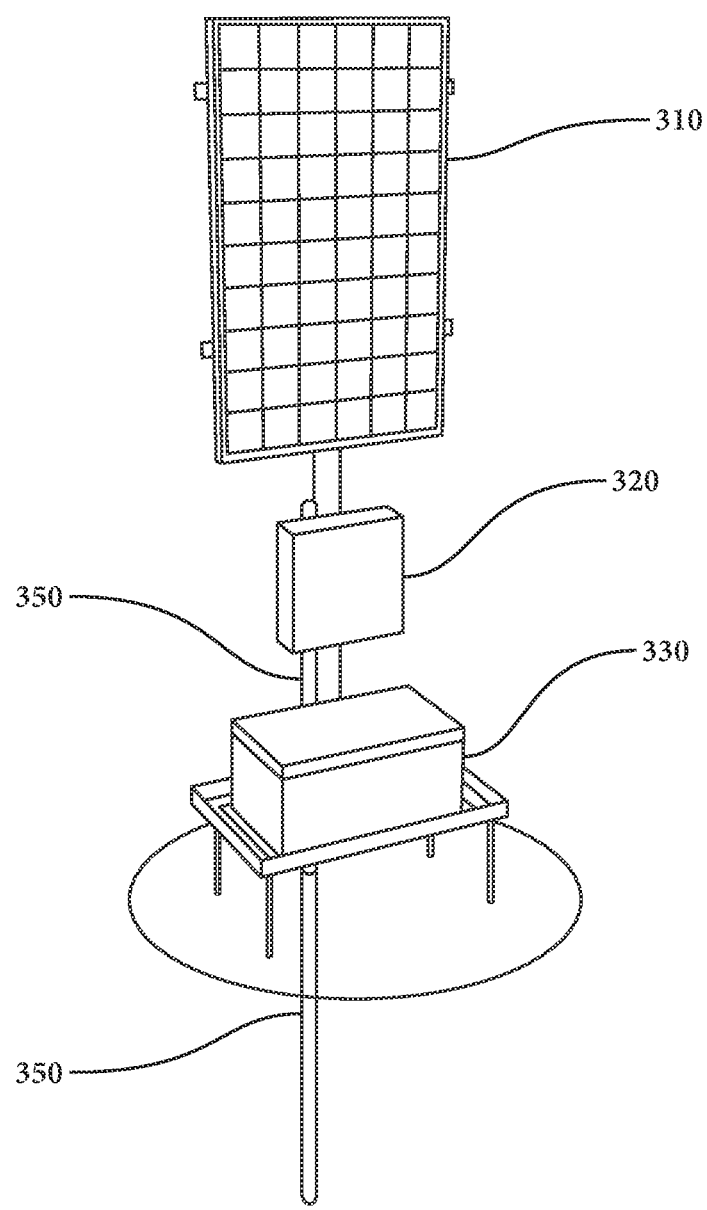
FIG. 2 illustrates the proposal of this application involving a heat pipe to address the needs in cold climates.

FIG. 2 represents the proposed system in closer detail. A smaller than normal solar panel 310 provides electrical power to an interrogator 320 containing the electronics and optical systems and stores excess power in the batteries 330 during daylight hours. A heat pipe 350 is provided and sunk deeply enough in the ground have the lower end always exposed to unfrozen ground. The heat pipe passes up through the battery system and the interrogator containing the electronics and optical systems, in each case contacting heat sinks in those enclosures.

Figure 3:
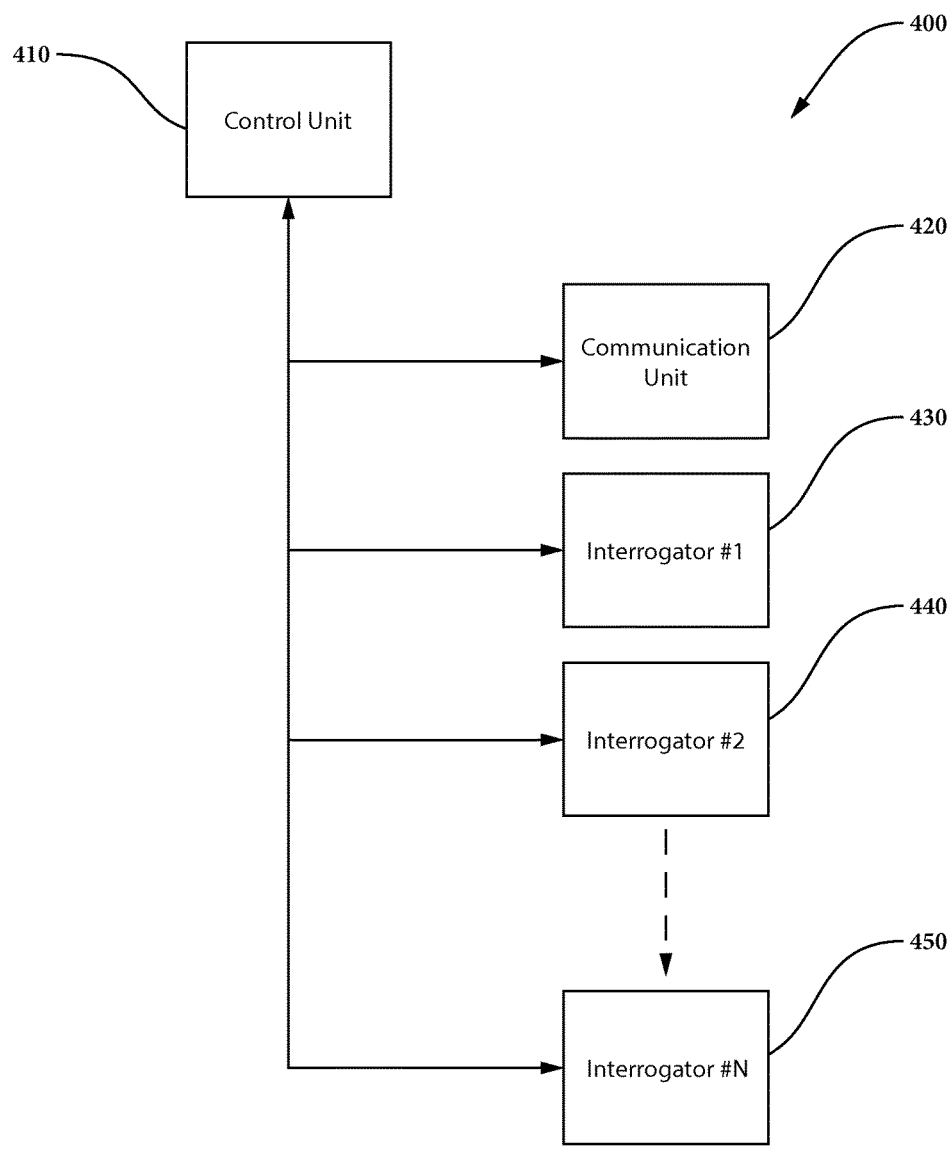
FIG. 3 illustrates possible internals of the interrogator system.

FIG. 3 represents a possible system 400 of the elements included in interrogator system 340. The system may have a communication unit 420 that can be used to receive commands from the control unit, and also to transmit data collected by the one or more interrogation units and/or the control unit the field. Data may include measured data, system status including battery power levels, power harvested by the solar panels and other relevant information.

The system may house one or several fiber optic interrogation units 430, 450, 460, and the system may have a control unit 410 that may control the interrogation units and turn the interrogation units on/off on demand to reduce power usage. The interrogation units may have a modular structure that enables power efficient operation by turning off power consuming sub-modules between measurements or the interrogation unit(s) maybe turned off completely by the control unit. The control unit may turn on interrogation units at some time before the actual measurement needs to be taken, and this time may depend on the temperature inside the system and/or the interrogation unit to allow the interrogation to reach thermal equilibrium thermally sensitive components prior to taking data. It may be desirable to monitor the system internal temperature and take data at the same temperature within a given time period to minimize thermally induced drift of the measurements. The control unit and/or interrogation unit(s) may have algorithms that activate heating or cooling modules as required for optimizing the power consumption to achieve stable and repeatable measurements. The control module may have capabilities to predict system up-time based on available solar power that is being harvested and available power in the batteries. The control system may only allow one interrogation unit to operate and take data at any given time and sequentially enable the various interrogation units to limit peak power usage. The system may e.g. have 3 interrogation units and/or modules, and each may consume e.g. 10 watts. Running all 3 units simultaneously would require minimum 30 watts of available power whereas running them sequentially one at the time would only require 10 watts of available power thus allowing a more economic system design.

The interrogation units may be based on Raman scattering, Brillouin Scattering, Rayleigh back scattering, coherent Rayleigh backscattering, tunable or fixed laser or other light sources capable of measuring light back scattered from Fiber Bragg Gratings (FBGs) and/or intrinsic Fabry-Perot cavities and/or extrinsic Fabry-Perot cavities and/or other interferometric sensors based on e.g. Michelson, Mach-Zehnder, Sagnac sensing principles etc. The interrogation unit(s) may be electrical interrogation units or a mix between electrical and optical interrogation units. The systems may be used to measure a number of parameters commonly used for reservoir monitoring and optimization including but not limited to temperature, pressure, vibration, acoustic, seismic, electro-magnetic fields, resistivity, pH or other chemical properties.

Figure 4:
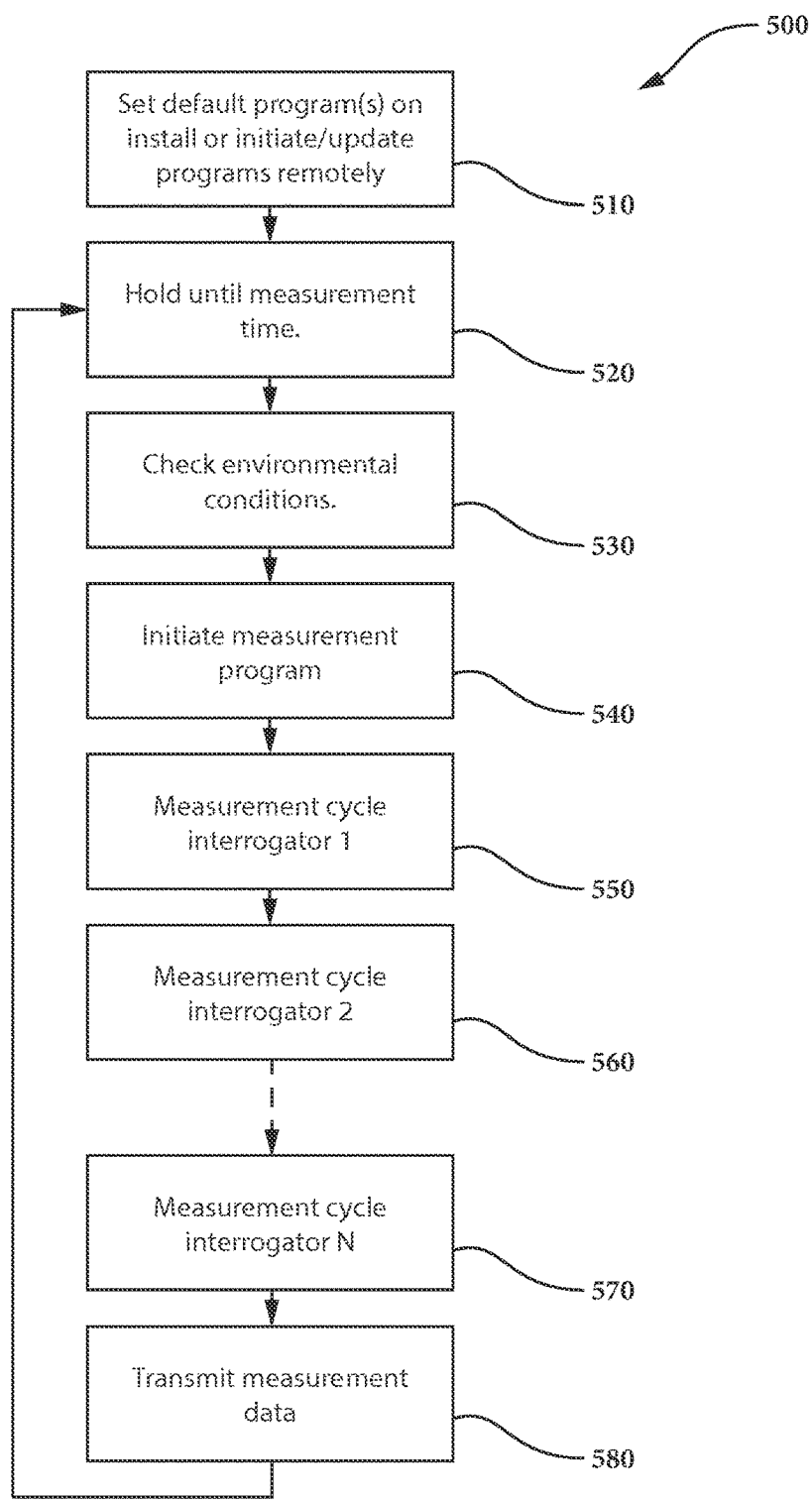
FIG. 4 illustrates the operational method of the interrogator system.

In use, the methodology for operation of these interrogator systems can be described by reference to FIG. 4. Step 510 indicates that the default control programs may be installed during installation of the overall system or that they can be set to initiate or update the program remotely. The sequence of events that are used may begin with a hold step 520 in which control unit 410 may turn on interrogation units at some time before the actual measurement needs to be taken, and this time may depend on the temperature inside the system and/or the interrogation unit to allow the interrogation to reach thermal equilibrium thermally sensitive components prior to taking data. In step 530 the environmental conditions may be checked to monitor the system internal temperature and take data at the same temperature within a given time period to minimize thermally induced drift of the measurements. In step 540 the measurement program is initiated. The control system can operate any or all of the interrogators but may only allow one interrogation unit to operate and take data at any given time and sequentially enable the various interrogation units to limit peak power usage. The measurement data from the one or more interrogator units are then collected and transmitted externally.

Heat pipes are normally used to cool hot spots in electronics and the proposal herein uses heat pipes to passively maintain and heat to a minimum temperature of electronics/optics. U.S. Pat. Nos. 5,987,890 and 8,274,787 both manage heat removal from systems and U.S. Pat. No. 4,437,456 discuss heat collection from a solar concentrator. Heat pipes may also be used in AC systems in heat exchangers.

Although certain embodiments and their advantages have been described herein in detail, it should be understood that various changes, substitutions and alterations could be made without departing from the coverage as defined by the appended claims. Moreover, the potential applications of the disclosed techniques is not intended to be limited to the particular embodiments of the processes, machines, manufactures, means, methods and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized. Accordingly, the appended claims are intended to include within their scope such processes, machines, manufactures, means, methods or steps.

The invention claimed is:

1. A method for operating fiber optic monitoring systems in cold climates comprising:
   a. deploying a heat pipe such that an upper portion of the heat pipe is deployed above ground surface and a lower portion of the heat pipe is deployed below the ground surface and through a frozen layer such that a lowermost portion of the lower portion is deployed at a depth at which the ground is unfrozen;
b. deploying the upper and lower portions of the heat pipe such that the upper portion terminates at a closed upper end and the lower portion terminates at a closed lower end that is substantially aligned with the closed upper end, and wherein the upper portion contacts heat sinks disposed in proximity to a fiber optic interrogator system and a battery system; and
c. wherein the heat pipe utilizes internal fluids chosen so that that the range of temperatures and pressures fall within the two-phase region of the fluid during winter conditions so that evaporation and condensation can occur.

2. The method of claim 1, further comprising: providing a control function within the fiber interrogator system for operating the one or more interrogator units.

3. The method of claim 2, further comprising: providing a communication function within the fiber interrogator system for receiving commands from the control function and transmitting data collected by the one or more interrogator units.

4. The method of claim 3, further comprising:
a. initiating a control program to perform the following:
   i. activate one or more of the fiber optic interrogator units;
   ii. allow the one or more interrogator units to reach a thermal equilibrium;
   iii. initiate the measurement program in one or more interrogator units; and
   iv. collect and transmit the measurement data externally.

5. A system for operating fiber optic monitoring systems in cold climates comprising:
a. a heat pipe including,
   i. an upper portion deployed above ground surface and terminating in a closed upper end; and
   ii. a lower portion deployed below the ground surface and through a frozen layer, wherein a closed lower end of the lower portion is deployed at a depth at which the ground is unfrozen;
b. a fiber optic interrogator system including electronics configured to collect measurement data, the fiber optic interrogator system positioned above the ground surface;
c. at least one solar panel oriented toward incoming sunlight for providing power to the fiber optic interrogator system;
d. a battery system for storing energy from the one or more solar panels and for powering the fiber optic interrogator system during inactive periods of the at least one solar panel; and
e. wherein the heat pipe contains and utilizes fluid chosen so that that the range of temperatures and pressures fall within the two-phase region of the fluid during winter conditions so that evaporation and condensation can occur, wherein the upper portion of the heat pipe contacts heat sinks disposed in proximity to the fiber optic interrogator system and the battery system.

6. The system of claim 5, further comprising:
a. one or more interrogator units contained within the fiber optic interrogator system;
b. a control unit for controlling the interrogator units; and
c. a communications unit to receive commands from the control unit and externally transmit data collected by the one or more interrogator units.

7. The system of claim 5, wherein the heat sinks are disposed within at least one enclosure containing the fiber optic interrogator system and the battery system.

8. The system of claim 5, wherein the interrogator units may be based on Raman scattering, Brillouin Scattering, Rayleigh back scattering, coherent Rayleigh backscattering, tunable or fixed laser or other light sources capable of measuring light back scattered from Fiber Bragg Gratings (FBGs) and/or intrinsic Fabry-Perot cavities and/or extrinsic Fabry-Perot cavities and/or other interferometric sensors based on Michelson, Mach-Zehnder, Sagnac sensing principles.

9. The system of claim 5, wherein the interrogator units may be electrical interrogation units or a mix between electrical and optical interrogation units.

* * * * *